United States Patent [19]
McAuley

[11] Patent Number: 5,526,370
[45] Date of Patent: Jun. 11, 1996

[54] WEIGHTED SUM CODES FOR ERROR DETECTION

[75] Inventor: Anthony J. McAuley, Glen Ridge, N.J.

[73] Assignee: Bell Communications Research, Inc., Morristown, N.J.

[21] Appl. No.: 222,628

[22] Filed: Apr. 4, 1994

[51] Int. Cl.$^6$ .................................................. G06F 11/10
[52] U.S. Cl. ............................................ 371/49.1; 371/48
[58] Field of Search ............................ 371/49.1, 48, 7, 371/15.1, 30, 49.2, 37.1, 67.1, 24, 68.2, 71, 20.1, 20.4

[56] References Cited

U.S. PATENT DOCUMENTS

| | | | |
|---|---|---|---|
| 4,637,022 | 1/1987 | Burke et al. | 371/37 |
| 4,815,106 | 3/1989 | Propp et al. | 375/36 |
| 4,864,531 | 9/1989 | Quatse et al. | 371/67.1 |
| 5,390,197 | 2/1995 | MacDonald et al. | 371/37.1 |

OTHER PUBLICATIONS

W. W. Peterson et al., *Proceedings of the IRE*, "Cyclic Codes for Error Detection," 1961, pp. 228–235.
J. G. Fletcher, *IEEE Transactions on Communications*, "An Arithmetic Checksum for Serial Transmissions," 1982, pp. 247–252.
*Transmission Control Protocol*, DARPA Internet Program Protocol Specification, MIL–STD–1778, 1981.
*XTP Definition 3.5 1991m* "Appendix A: Check Function," Protocol Engines Inc., Santa Barbara, CA.

Primary Examiner—Robert W. Beausoliel, Jr.
Assistant Examiner—Phung My Chung
Attorney, Agent, or Firm—Leonard Charles Suchyta; James W. Falk

[57] ABSTRACT

A new class of error detection codes has powerful error detection properties, as well as significant implementation advantages. The inventive error detection codes are used in communication protocols to protect transmitted data from corruption.

8 Claims, 4 Drawing Sheets

| WORD | ALIAS | SIZE | BINARY REPRESENTATION |
|---|---|---|---|
| DATA | Q | k | $q_{k-1}, q_{k-2}, \ldots, q_0$ |
| PARITY | P | h | $p_{h-1}, p_{h-2}, \ldots, p_0$ |
| TRANSMITTED CODEWORD | R | h+k | $q_{k-1}, q_{k-2}, \ldots, q_0, p_{h-1}, p_{h-2}, \ldots, p_0$ |
| ERROR POLYNOMIAL | E | h+k | $e_{k+h-1}, e_{k+h-2}, \ldots, e_0$ |
| RECEIVED CODEWORD | R* | h+k | NOT USED |
| MODULUS | M | VARIES | NOT USED |

FIG. 3

| WORD | ALIAS | SIZE (BITS) | BINARY REPRESENTATION |
|---|---|---|---|
| BOTTOM HALF OF PARITY | $P_0$ | $h/2$ | $p_{(h/2-1)}, p_{(h/2-2)}, \ldots, p_0$ |
| TOP HALF OF PARITY | $P_1$ | $h/2$ | $p_{h-1}, p_{h-2}, \ldots, p_{h/2}$ |
| DATA SYMBOL | $Q_i$ | $h/2$ | $q_{((i+1) \times (h/2))-1}, q_{((i+1) \times (h/2))-2}, \ldots, q_{(i) \times (h/2)}$ |
| SYMBOL OF CODEWORD | $R_i$ | $h/2$ | NOT USED |
| WEIGHT | $W_i$ | $h/2$ | NOT USED |

FIG. 4

```
1.   P0 ← 0;                        /*INITIALIZE PARTIAL PARITY*/
2.   FOR ALL SYMBOLS Qi             /*STEP IN ANY ORDER*/
3.   BEGIN                          /*FOR ALL 2k/h SYMBOLS OF DATA*/
4.       P0 ← P0 ⊕ Qi;              /*P0=P0⊕Qi*/
5.   END
6.   P0 ← P0 ⊕ P1;                  /*P0=P0⊕P1*/
```

FIG. 5

```
1.   X ← 2^(h/2);                              /*X=2^(h/2)*/
2.   P1 ← 0;                                   /*INITIALIZE PARTIAL PARITY*/
3.   FOR i ← (2k/h)-1 STEP -1 UNTIL 0 DO       /*STEP IN REVERSE ORDER*/
4.   BEGIN                                     /*FOR ALL 2k/h SYMBOLS OF DATA*/
5.       P1 ← P1 ⊕ Qi;                         /*P1=P1+Qi*/
6.       P1 ← P1 × 2;                          /*P1=P1 SHIFTED LEFT ONCE*/
7.       IF ((X AND P1)=0) P1 ← P1 ⊕ M;        /*P1=P1 MOD M*/
8.   END
```

```
1.    X ← 2^(h/2);                        /*X=2^(h/2)*/
2.    P_1 ← 0;                            /*INITIALIZE PARTIAL PARITY*/
3.    FOR ALL SYMBOLS Q_i                 /*STEP IN ANY ORDER*/
4.    BEGIN                               /*FOR ALL 2k/h SYMBOLS OF DATA*/
5.        P_1 ← P_1 ⊕ POLY_MULTIPLY(i,Q_i); /*P_1=P_1⊕Q_i.[i]*/
6.    END
```

WEIGHTED SUM CODES FOR ERROR DETECTION

FIELD OF THE INVENTION

The present invention relates to an error detection code used to protect data transmitted via a high speed communication channel from corruption.

BACKGROUND OF THE INVENTION

A network communication protocol uses error detection codes to protect data from corruption. The transmitter calculates parity bits and appends the parity bits to a block of data which is transmitted to a receiver. The receiver recalculates the parity bits based on the information it receives. Only if the received and receiver calculated parities are identical is the received block of data assumed to be error free. The code used to calculate the parities determines how well the information is protected and how easy it is to calculate the parities.

FIG. 1 shows a typical communication system 10. The transmitter 12 appends an h-bit parity word P to a k-bit data word Q to form a redundant codeword R. The parity word P is calculated using a particular error correction code. The redundant codeword R is transmitted via channel 14 to a receiver 16. The redundant codeword R may be corrupted in the channel 14 due to noise or other reasons. Thus, the codeword that is received at the receiver 16 is designated R*.

The received codeword R* may be viewed as being formed by the polynomial addition of R and an error polynomial E. The error polynomial E has non-zero terms in those bit positions where there is an error. Because R is a valid codeword and polynomial addition is linear, R* will be a valid codeword only if the error polynomial E is also a valid codeword. Thus, an error will be detected at the receiver as long as the error polynomial E is not also a valid codeword. FIG. 2 shows the binary representation of Q, P, R and E.

For some error detection codes, the k-bit data word Q is divided into a plurality of h/2-bit symbols, each of which is labeled $Q_i$. Similarly, the transmitted redundant codeword R may be divided into h/2-bit symbols labeled $R_i$. In this case, the parity word P is divided into two h/2-bit symbols, the top half parity symbol $P_1$ and the bottom half parity symbol $P_0$. FIG. 3 shows the binary representations of $P_0$, $P_1$ and $Q_i$.

There are four error detection parameters which may be utilized in characterizing the error detection capabilities of an error detection code. These parameters are:

h—numbers of redundant (i.e. parity) bits k—maximum number of message bits that can be protected using h parity bits d—minimum number of bits that must be changed to make any codeword of (h+k) bits into any other codeword b—maximum error burst length that is always detected, e.g. if an error changes bits 11, 13 and 15, the burst length is five.

The number of parity bits h is the key parameter for an error detection code because the chance of a random error resulting in the correct parities is at least $2^{-h}$. An error detection code with distance d guarantees detecting all errors which change less than d bits in a block of k bits.

Typically, the number of parity bits h is fixed by the application requirements. Once h is fixed, the three remaining parameters used to describe the error detection capabilities should be as follows:

d large as possible to detect all small errors b large as possible to detect a large single block of errors k large as possible to allow large error detection blocks There are a number of error detection codes disclosed in the prior art. However, the prior art error correction codes have certain shortcomings. For example, the well known CRC (Cyclic Redundancy Code) has very strong error detection characteristics. However, the CRC requires data to be processed in the originally transmitted order. In addition, some embodiments of the CRC code are very slow when implemented in software. The CRC code is disclosed in W. W. Peterson et al., "Cyclic Codes for Error Detection," Proceedings of the IRE, pp. 228–235, January 1961. Another prior art error detection code is the Fletcher Checksum. The Fletcher Checksum can be implemented efficiently in software but has weaker error detection capabilities than CRC and still requires perfectly ordered data. The Fletcher Checksum is disclosed in J. G. Fletcher, "An Arithmetic Checksum For Serial Transmissions," IEEE Transactions on Communications, Vol. COM-80, No. 1, pp. 247–252, January 1982. The TCP (Transmission Control Protocol) offers efficient software implementation and out of order processing, but it has even weaker error detection properties. The TCP is disclosed in Department of Defense, "Transmission Control Protocol," MIL-STD-1778, May 1983. Another error detection code known as XTP CXOR is disclosed in XTP Definition 3.5, 1991m "Appendix A: Check Function," Protocol Engines Inc., 1421 State Street, Santa Barbara, Calif. 93101.

It is an object of the present invention to provide an error detection code which overcomes the shortcomings of the prior art error correction codes. More specifically, it is an object of the invention to provide an error detection code which has powerful error detection properties (i.e., large d, b, k for a given h) but also has a simple software and/or hardware implementation.

SUMMARY OF THE INVENTION

In a preferred embodiment, the present invention is directed to a method for coding data to be transmitted using a unique error detection code. The error detection code of the present invention is referred to as a Weighted Sum Code. The Weighted Sum Code of the present invention utilizes polynomial arithmetic for its calculations. The Weighted Sum Code divides each k-bit data word Q into one or more symbols $Q_i$ each of which has h/2 bits. The parity word P is divided into a bottom half parity symbol $P_0$ and a top half parity symbol $P_1$, each of which has h/2 bits. In accordance with the invention, the parity symbols $P_0$ and $P_1$ are chosen as follows:

$$P_1 = \sum_{i=0}^{(2k/h)-1} W_i \times Q_i = 0 \bmod M \quad \text{(A)}$$

$$P_0 \oplus P_1 = \sum_{i=0}^{(2k/h)-1} Q_i = 0 \quad \text{(B)}$$

These equations can be rewritten as $$P_1 = W_{(2k/h)-1} \times Q_{(2k/h)-1} \oplus W_{(2k/h)-2} \times Q_{(2k/h)-2} \oplus \ldots \oplus W_0 \times Q_0 \bmod M \quad (1)$$

$$P_0 = Q_{(2k/h)-1} \oplus Q_{(2k/h)-2} \oplus \ldots \oplus Q_0 \oplus P_1 \quad (2)$$

In equations (1) and (2), multiplication (×) and addition ($\oplus$) are of two h/2 bit polynomials. For example, if h=8, then a minimum sized codeword (with k=4) comprises a four bit message ($Q_o$) and two four-bit parity symbols ($P_0$ and $P_1$).

When the data and parity symbols are expanded into their binary polynomial representations, equation (1) becomes:

$$\{p_{h-1}x^{(h/2)-1} + p_{h-2}x^{(h/2)-2} + \ldots + p_{(h/2)}\} = \quad (3)$$

$$W_{(2k/h)-1} \times \{q_{k-1}x^{(h/2)-1} + q_{k-2}x^{(h/2)-2} + \ldots + q_{k-(h/2)}\} \oplus$$

$$W_{(2k/h)-2} \times \{q_{k-(h/2)-1}x^{(h/2)-1} + q_{k-(h/2)-2} \cdot x^{(h/2)-2} + \ldots + q_{k-h}\} \oplus$$

$$\ldots \oplus$$

$$W_0 \times \{q_{(h/2)-1}x^{(h/2)-1} + q_{(h/2)-2}x^{(h/2)-2} + \ldots + q_0\} \bmod M$$

and equation (2) becomes:

$$\{p_{(h/2)-1}x^{(h/2)-1} + p_{(h/2)-2}x^{(h/2)-2} + \ldots + p_0\} = \quad (4)$$

$$\{q_{k-1}x^{(h/2)-1} + q_{k-2}x^{(h/2)-2} + \ldots + q_{k-(h/2)}\} \oplus$$

$$\{q_{k-(h/2)-1}x^{(h/2)-1} + q_{k-(h/2)-2}x^{(h/2)-2} + \ldots + q_{k-h}\} \oplus$$

$$\ldots \oplus$$

$$\{q_{(h/2)-1} \cdot x^{(h/2)-1} + q_{(h/2)-2}x^{(h/2)-2} + \ldots + q_0\} \oplus$$

$$\{p_{h-1}x^{(h/2)-1} + p_{h-2}x^{(h/2)-2} + \ldots + p_{(h/2)}\}$$

In equations (1) and (3), the modulus M is a primitive polynomial of degree h/2 (e.g. h=8, $M=x^4+x+1$; h=16, $M=x^8+x^4\ x^3+x^2+1$). The h/2-bit weight symbols W are chosen so that they go through a maximal length sequence including all possible $2^{(h/2)}$ symbols except for zero and one.

The inventive Weighted Sum Codes are used in accordance with the present invention as follows. At a transmitter, a k-bit message Q comprised of h/2-bit symbols $Q_i$ is generated. A processor, in the form of a general purpose microprocessor or other CPU or a special purpose circuit, calculates the parity symbols $P_0$ and $P_1$. The parity symbols $P_0$, $P_1$ are appended to the message Q to form the redundant codeword R. The redundant codeword R is transmitted via a communication channel to a receiver. The receiver, using a general purpose microprocessor or other CPU or a special purpose hardware circuit, recalculates the parity symbols $P_0$, $P_1$ to determine if any bits were transmitted in error.

The Weighted Sum Codes of the present invention have some extremely desirable error detection characteristics. The Weighted Sum Codes have the same distance (d) and burst error protection (b) as CRC. The inventive Weighted Sum Codes have a smaller but still acceptable maximum error detection block size. Specifically in CRC:

d=4
b=h
$k=2^h$

In the Weighted Sum Codes of the present invention:

d=4
b=h
$k=(h/2) \times (2^{h/2}-1)$

Moreover, the inventive Weighted Sum Codes are easy to implement in both software and hardware and have the ability to process data in any order.

BRIEF DESCRIPTION OF THE DRAWING

FIG. 1 schematically illustrates a communication system.

FIG. 2 and FIG. 3 are tables which provide binary representations for various quantities used in the transmission of messages that are coded for error protection.

FIG. 4 illustrates a program for calculating a bottom half parity symbol $P_0$ in accordance with the invention.

FIG. 5 illustrates a program for calculating a top half parity symbol $P_1$ for one Weighted Sum Code in accordance with the invention.

DETAILED DESCRIPTION OF THE INVENTION

Figures 1, 2:
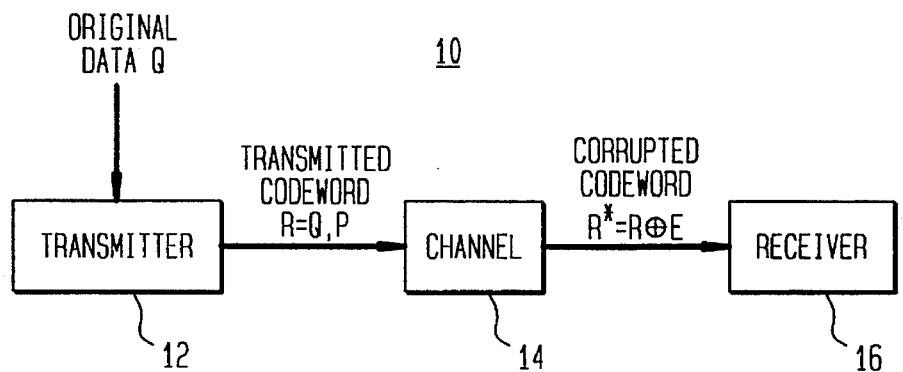

Two examples of the Weighted Sum Codes of the present invention known as WSC-1 and WSC-2, are provided below,

A) WSC-1

The WSC-1 error detection code uses weights defined by $$W_i = x^{(i+1)} \bmod M$$

$$W_0=x, W_1 x^2, W_2=x^3, W^3=x^4 \cdots \quad (5)$$

Therefore from equations (1) and (5)

$$P_1=(x^{(2k/h)}) \times Q_{(2k/h)-1} \oplus (x^{2k/h)-1}) \times Q_{(2k/h)-2} \oplus \ldots \\ \oplus (x) \times Q_0 \bmod M \quad (6)$$

$P_0$ is then determined according to equation (2).

WSC-1 uses equations (6) and (2) to generate the parity symbols $P_1$ and $P_0$ from the data symbols $Q_i$. For example, with h=8 and $M=x^4+x+1$, if it is desired to transmit the k=16 bits of data Q=1101 0111 0101 1010, then from equation (6), it can be determined $$P_1=(x^4) \times (x^3+x^2+1)+(x^3) \times (x^2+x+1)+(x^2) \times (x^2+1)+(x) \times (x^3+x) \bmod x^4+x+1$$

$$P_1=x^7+x^6+x^5+x^3 \bmod x^4+x+1$$

$$P_1=x^3+1=1001 \quad (7)$$

and $$P_0=(x^3+x^2+1)+(x^2+x+1)+(x^2+1)+(x^3+x)+P_1$$

$$P_0=(x^3+x^2+1)+(x^2+x+1)+(x^2+1)+(x^3+x)+(x^3+1)$$

$$P_0=x^3+x^2=1100 \quad (8)$$

Therefore, the transmitted redundant codeword is by $R=Q,P_1,P_0=1101\ 0111\ 0101\ 1001\ 1100$

B) WSC-2

The WSC-2 error detection code uses weights defined by $$W_i=[i+2] \bmod M \quad (9)$$

where [i+2] means the polynomial representation of the integer [i+2], i.e.

$$W_0 = x$$

$$W_1 = x+1$$

$$W_2 + x^2$$

$$W_3 = x^2 + 1$$

.
.

Using equation (9) and equation (1), the parity symbol $P_1$ is given by $$P_1 = ([(2k/h)+1]) \times Q_{(2k/h)-1} \oplus ([2k/h]) \times Q_{(2k/h)-2} \oplus \ldots \oplus (x) \times Q_0 \bmod M \quad (10)$$

The parity symbol $P_0$ is then given by equation (2).

For example, with $h=8$ and $M = x^4+x+1$, to transmit $Q = 1101\ 0101\ 1010$, it can be determined that $$P_1 = (x^2+1) \times (x^3+x^2+1) + (x^2) \times (x^2+x+1) + (x+1) \times (x^2+1) + (x) \times (x^3+x) \bmod x^4+x+1$$

$$P_1 = x^5+x^4+x^3+x^2+x \bmod x^4+x+1$$

$$P_1 = x^3+x+1 = 1011 \quad (11)$$

and $$P_0 = (x^3+x^2+1) + (x^2+x+1) + (x^2+1) + (x^3+x) + P_1$$

$$P_0 = (x^3+x^2+1) + (x^2+x+1) + (x^2+1) + (x^3+x) + (x^3+x) + (x^3+x+1)$$

$$P_0 = x^3+x^2+x = 1110 \quad (12)$$

The transmitted redundant codeword $R = Q, P_1, P_0$ is given by $R = 1101\ 0111\ 0101\ 1010\ 1011\ 1110$ C) Software Implementation The Weighted Sum Codes of the present invention may in particular cases be implemented in software or hardware. An illustrative software implementation is considered first.

A program in pseudocode for calculating $P_0$ by implementing equation 2 is shown in FIG. 4.

In each clock cycle, the program of FIG. 4 takes a symbol of data $Q_i$ in any order and adds it using bitwise exclusive-OR addition to the current partial parity symbol $P_0$. Finally, the program of FIG. 4 adds $P_1$ to the last partial parity symbol $P_0$ to obtain a final value for $P_0$. The program of FIG. 4 is useful for all embodiments of the Weighted Sum Codes.

FIG. 5 illustrates a program for determining $P_1$ for the WSC-1 code. The program of FIG. 5 does not directly implement equation (6). Instead, equation (6) is rewritten recursively as follows $$((\ldots ((((Q_{(2k/h)-1}) \times x) \oplus Q_{2k/h-2}) \times x) \oplus \ldots \oplus Q_0) \times x) \oplus P_1 = 0 \bmod M \quad (13)$$

The program of FIG. 5 implements equation (13). The program starts with the most significant symbol of data $Q_{(2k/h-1)}$ and works down. In the worst case, the main loop (lines 4–7) has two adds, a multiply by two, a logical AND, and a test. The program of FIG. 5 is illustrated below using the above-described example where $h=8$, $M=x^4+x+1$ and $Q=1101\ 0111\ 0101\ 1010$.

initially:

$$P_1 = 0$$

i=3:

$$P_1 = (((0)+(x^3+x^2+1)) \times x \bmod x^4+x+1 = (x^4+x^3+x)+(x^4+x+1) = x^3+1$$

i=2:

$$P_1 = ((x^3+1)+(x^2+x+1)) \times x \bmod x^4+x+1 = (x^4+x^3+x^2)+(x^4+x+1) = x^3+x^2+x+1$$

i=1:

$$P_1 = ((x^3+x^2+x+1)+(x^3+x)) \times x \bmod x^4+x+1 = (x^4+x^3+x)+(x^4+x+1) = x^3+x+1$$

i=0:

$$P_1 = ((x^2+x+1)+(x^3+x)) \times x \bmod x^4+x+1 = (x^4+x^3+x)+(x^4+x+1) = x^3+`$$

Figures 6, 7:
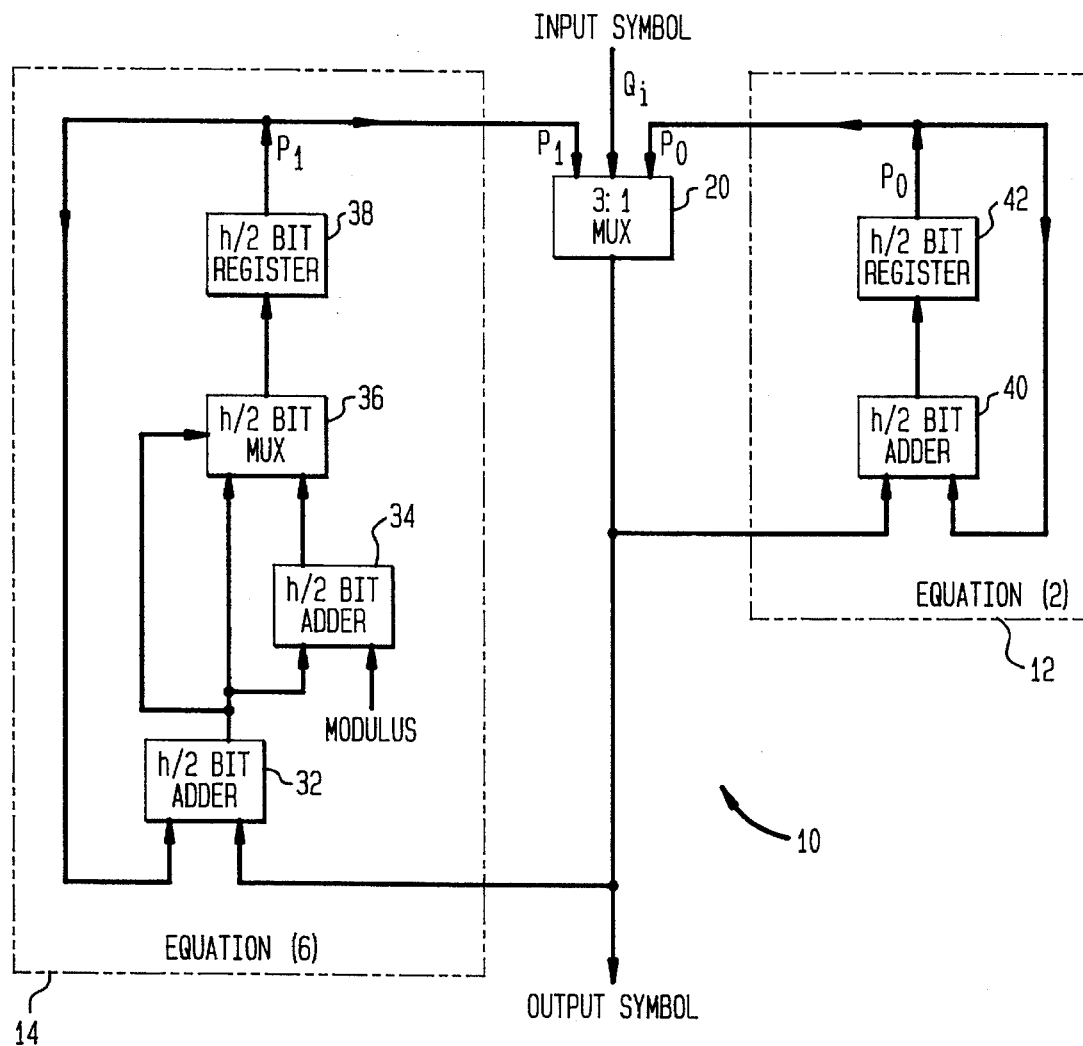
FIG. 6 illustrates a program for calculating a top half parity symbol $P_1$ for a second Weighted Sum Code in accordance with the invention.
FIG. 7 illustrates a circuit for determining parity symbols $P_1$ and $P_0$ for a first weighted sum code in accordance with the invention.

FIG. 6 illustrates a program for determining $P_1$ for the WSC-2 code. In each clock cycle, the program of FIG. 6 takes a symbol of data $Q_i$, in any order, multiplies it with the symbol's index i, then adds it using bitwise exclusive-OR addition with the current partial parity $P_1$. The subroutine for poly-multiply (line 5 of FIG. 6) operates in a serial mode with a main loop of h/2 cycles. Thus, the number of instructions is proportional to h.

Preferably, when a software implementation of the inventive Weighted Sum Codes is used, the programs for determining $P_1$ and $P_0$ are executed by a general purpose processor (e.g. a microprocessor) located in a transmitter. The resulting values of $P_1$ and $P_0$ are then appended to a data word Q to form a redundant code word R. The redundant code word R is then transmitted via a communications channel to a receiver. The receiver also includes a microprocessor which executes the program to recalculate $P_1$ and $P_0$. The transmitted and recalculated values of $P_1$ and $P_0$ are compared to determine if there are any transmission errors.

D) Hardware Implementation

Instead of using a microprocessor at the transmitter and receiver to determine $P_1$ and $P_0$, special purpose circuitry may be used.

FIG. 7 illustrates a circuit 10 for determining $P_1$ and $P_0$ for WSC-1.

The circuit 10 comprises a first circuit 12 for determining $P_0$ according to equation (2) and a second circuit 14 determining $P_1$ according to equation (13).

The circuit 10 also includes a multiplexer 20. The multiplexer has three inputs labeled $P_1$, $P_0$, and $Q_i$. The multiplexer selectively passes one of these inputs to the single multiplexer output.

The circuit 14 for determining $P_1$ comprises two h/2-bit polynomial adders 32 and 34, an h/2-bit multiplexer 36 and an h/2-bit register 38. The circuit 14 implements the loop set forth in lines 3–8 of FIG. 5. Initially, P1 is set equal to zero. During each cycle, a symbol $Q_i$ is inputted from the multiplexer 20 to the circuit 14. The h/2-bit adder implements the addition step of line 5 of FIG. 5 as well as the multiply by 2 (i.e. left shift) step of line 6. The step in line 7 wherein $P_1 \rightarrow P_1 \oplus M$ is implemented by the h/2-bit adder 34. The "if" statement of line 7 is implemented by the multiplexer 36. The resulting partial parity symbol $P_1$ obtained after each cycle is stored in the register 38. The partial parity symbol $P_1$ stored in the register 38 is then fed back to the adder 32. The process is continued until the final value of $P_1$ is stored in the register 38.

The circuit 12 for determining $P_0$ comprises an h/2-bit adder 40 and an h/2-bit register 42. The value of $P_0$ is initially set to zero and stored in the register 42. During each cycle (except the last cycle) the multiplexer 20 output a symbol $Q_i$ to the adder 40 and the partial $P_0$ value stored in the register 42 is also outputted back to the adder 40. The adder 40 adds the partial $P_0$ value and $Q_i$ and stores the new partial $P_0$ value in the register 42. In the last cycle, the multiplexer outputs $P_1$ to the adder 40. The adder 40 adds $P_1$ and the partial $P_0$ value in the register 42 to obtain the final value for $P_0$.

Figure 8:
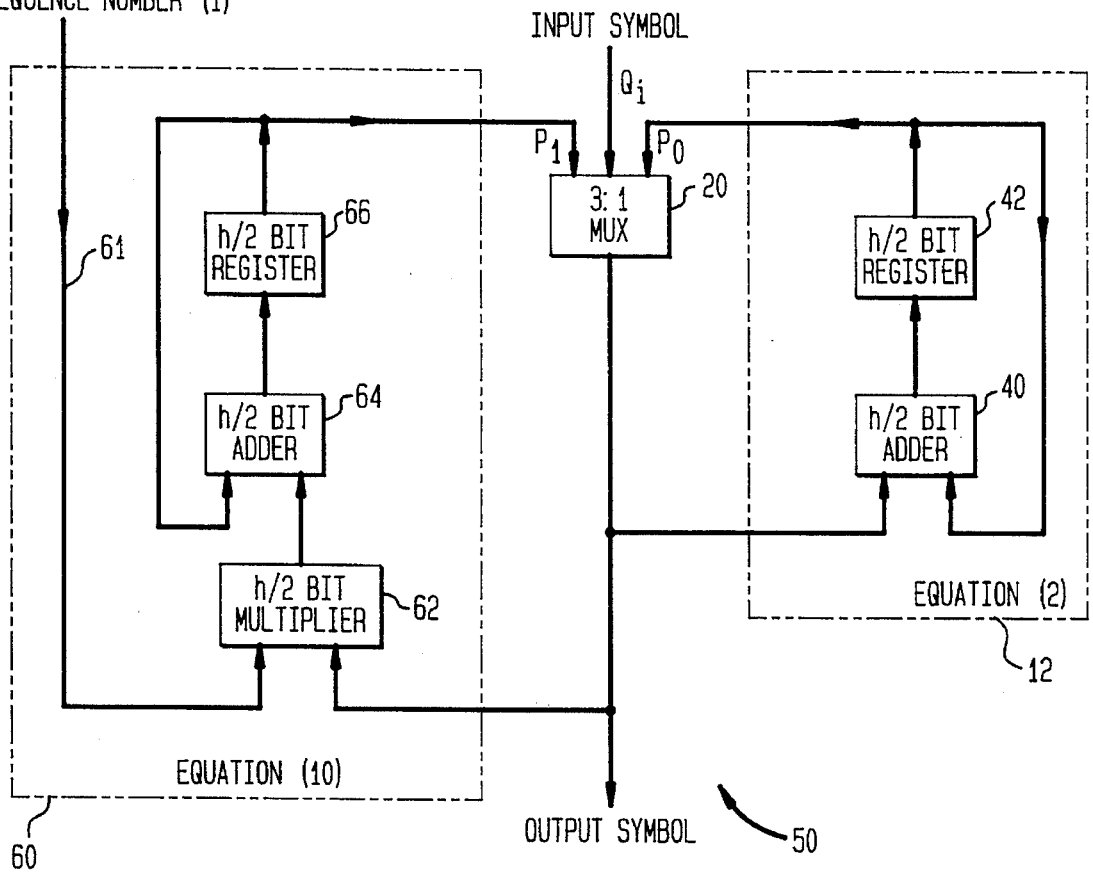
FIG. 8 illustrates a circuit for determining parity symbols $P_1$ and $P_0$ for a second Weighted Sum Code in accordance with the invention.

FIG. 8 illustrates a circuit for determining $P_1$ and $P_0$ for the WSC-2 code mentioned above.

The circuit 50 of FIG. 8 comprises a circuit 12 for calculating $P_0$ and a multiplexer 20. The circuit 12 and multiplexer 20 are identical to the corresponding elements of FIG. 7. The circuit 50 of FIG. 8 also comprises a circuit 60 for determining $P_1$. The circuit 60 comprises an h/2-bit multiplexer 62, an h/2-bit adder 64 and an h/2-bit register 66. The circuit 60 operates by implementing the steps of lines 2–5 of the program of FIG. 6. Initially, a partial value of $P_1$ is set to zero and stored in the register 66. In each cycle, the multiplier 62 receives a data symbol $Q_i$ from the multiplexer 20 and a sequence number 10 from the input 61. The multiplier 62 multiplies $Q_i$ by the polynomial [i]. The result is added by the adder 64 to the partial $P_1$ value stored in the register 66 to form a new-partial $P_1$ value which is stored in the register 66. The process continues until the final value of $P_1$ is stored in the register 66.

In short, a new set of error detection codes has been disclosed. The error detection codes are used to detect errors in data transmitted over a communication channel. The new error detection codes have strong error detection capabilities as well as significant implementation advantages. Finally, the above described embodiments of the invention are intended to be illustrative only. Numerous alternative embodiments may be devised by those skilled in the art without departing from the spirit and scope of the following claims.

I claim:

1. A method for transmitting a k bit data word Q via a communication channel, wherein said data word Q comprises one or more h/2 bit data symbols $Q_i$, were h and k are positive integers, said method comprising the steps of:

at a transmitter, determining a first parity symbol $P_1$ where $P_1$ is given by $$P_1 = W_{(2k/h)-1} \times Q_{(2k/h)-1} \oplus W_{(2k/h)-2} \times Q_{(2k/h)-2} \oplus \ldots \oplus W_0 \times Q_0 \bmod M;$$

at said transmitter, determining a second parity symbol $P_0$, where $P_0$ is given by $$P_0 = Q_{(2k/h)-1} \oplus Q_{(2k/h)-2} \oplus \ldots \oplus Q_0 \oplus P_1;$$

forming a redundant codeword R which includes said data word Q and said first and second parity symbols $P_1$ and $P_0$; and transmitting said redundant codeword R from said transmitter via said communication channel to a receiver, wherein said first and second parity symbols $P_1$ and $P_0$ have h/2 bits, each W is a weight symbol, and M is a primitive polynomial of degree h/2.

2. The method of claim 1 further comprising the steps of:

receiving said redundant codeword R at said receiver after transmission via said channel, recalculating said first and second parity symbols $P_0$ and $P_1$ at said receiver, and comparing the recalculated first and second parity symbols $P_0$ and $P_1$ with the first and second parity symbols $P_0$ and $P_1$ transmitted from said transmitter.

3. The method of claim 1 wherein said weight symbols W are given by $$W = x^{(i+1)} \bmod M$$

where x is a variable used in the representative of polynomials.

4. The method of claim 1 wherein said weight symbols W are given by $$W_i = [i+2] \bmod M$$

where [[j]] [i+2] indicates the polynomial representation of the integer [j]i+2.

5. A method for redundantly encoding a k bit data word Q comprised of one or more h/2 bit symbols $Q_i$ to enable subsequent detection of an error in the data word Q, where h and k are positive integers, said method comprising the steps of:

(1) at an encoding device, electronically determining a first parity symbol $P_1$, where $P_1$ is given by $$P_1 = W_{2k/h)-1} \times Q_{(2k/h)-1} \oplus W_{2k/h)-2} \times Q_{(2K/h)-2} \oplus \ldots \oplus W_0 \times Q_0 \bmod M;$$

(2) at said encoding device, electronically determining a second parity symbol $P_0$, where $P_0$ is given by $$P_0 = 1_{(2k/h)-1} \oplus Q_{(2k/h)-2} \oplus \ldots \oplus Q_0 \oplus P_1;\text{ and}$$

(3) encoding said data word Q to enable the subsequent detection of an error in said data word Q by forming a redundant codeword including said data word Q and said first and second parity symbols $P_1$ and $P_0$, wherein said first and second parity symbols $P_1$ and $P_0$ have h/2 bits, each W is a weight symbol, and M is a primitive polynomial of degree h/2.

6. The method of claim 5 further comprising the step of transmitting said redundant codeword via a communication channel to a receiver.

7. The method of claim 6 further comprising the step of recalculating said first and second parity symbols $P_1$ and $P_0$ at said receiver to determine if said redundant codeword received at said receiver contains an error introduced by said communication channel.

8. The method of claim 5 wherein each weight set W consisting of the h/2 bits symbols Wi contains all possible $2^{(h/2)}$ values except zero and one.

* * * * *